(12) United States Patent
Mi et al.

(10) Patent No.: US 11,315,472 B2
(45) Date of Patent: Apr. 26, 2022

(54) SHIFT REGISTER UNIT, GATE DRIVING CIRCUIT AND DRIVING METHOD THEREOF, DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Lei Mi, Beijing (CN); Yanchen Li, Beijing (CN); Yanna Xue, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 603 days.

(21) Appl. No.: 16/336,274

(22) PCT Filed: Jul. 6, 2018

(86) PCT No.: PCT/CN2018/094849
§ 371 (c)(1),
(2) Date: Mar. 25, 2019

(87) PCT Pub. No.: WO2019/062265
PCT Pub. Date: Apr. 4, 2019

(65) Prior Publication Data
US 2021/0366351 A1 Nov. 25, 2021

(30) Foreign Application Priority Data
Sep. 29, 2017 (CN) .......................... 201710910077.6

(51) Int. Cl.
*G09G 3/20* (2006.01)

(52) U.S. Cl.
CPC ... *G09G 3/2092* (2013.01); *G09G 2300/0426* (2013.01); *G09G 2310/0267* (2013.01);
(Continued)

(58) Field of Classification Search
None
See application file for complete search history.

(56) References Cited

U.S. PATENT DOCUMENTS

| 10,175,925 B2 | 1/2019 | Dun |
| 2015/0123826 A1 | 5/2015 | Lee et al. |

(Continued)

FOREIGN PATENT DOCUMENTS

| CN | 101777386 A | 7/2010 |
| CN | 106023874 A | 10/2016 |

(Continued)

OTHER PUBLICATIONS

International Search Report and Written Opinion dated Oct. 10, 2018 from State Intellectual Property Office of the P.R. China.

*Primary Examiner* — Christopher J Kohlman
(74) *Attorney, Agent, or Firm* — Dilworth & Barrese, LLP.; Michael J. Musella, Esq.

(57) ABSTRACT

A shift register unit, a gate driving circuit and a driving method thereof, a display device. The shift register unit includes: a first input circuit configured for outputting a voltage of a first voltage terminal to a pull-up node under a control of a first signal terminal; a second input circuit configured for outputting a voltage of a second voltage terminal to the pull-up node under a control of a second signal terminal; an output circuit configured for outputting a clock signal of a clock signal terminal to the signal output terminal under a control of the pull-up node; a pull-up node
(Continued)

reset circuit configured for outputting a voltage of the third voltage terminal to the pull-up node under a control of the third signal terminal.

20 Claims, 7 Drawing Sheets

(52) U.S. Cl.
 CPC ............... *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 2017/0032750 A1* | 2/2017 | Shao | G11C 19/28 |
| 2017/0153742 A1* | 6/2017 | Pang | G09G 3/2096 |
| 2018/0025687 A1* | 1/2018 | Wang | G09G 3/3266 |
| | | | 345/213 |

FOREIGN PATENT DOCUMENTS

| | | |
|---|---|---|
| CN | 106057147 A | 10/2016 |
| CN | 160128364 A | 11/2016 |
| CN | 107464521 A | 12/2017 |

* cited by examiner

SHIFT REGISTER UNIT, GATE DRIVING CIRCUIT AND DRIVING METHOD THEREOF, DISPLAY DEVICE

The present application claims priority to Chinese Patent Application No. 201710910077.6, filed on Sep. 29, 2017, the disclosure of which is incorporated herein by reference in its entirety as part of the present application.

TECHNICAL FIELD

The embodiments of the present disclosure relate to a shift register unit, a gate driving circuit and a driving method thereof, and a display device.

BACKGROUND

In recent years, the development of displays presents trends of high integration and low costs. The implementation of mass production of GOA (Gate Driver on Array) technologies is of great importance. A gate driving circuit is integrated on an array substrate of the display panel using the GOA technology, thereby reducing product costs in terms of material costs and manufacturing processes. A gate switching circuit which integrates the gate driving circuit on the array substrate using the GOA technology is also referred to as a GOA circuit or a shift register circuit, and this GOA circuit includes a plurality of cascaded shift register units. Currently, both a pull-up control structure and a pull-down control structure in each shift register unit of the GOA circuit include thin film transistors (TFT). Due to the leakage current of the TFT itself, the GOA circuit tends to have various poor situations.

SUMMARY

At least one embodiment of the present disclosure provides a shift register unit, which comprises a first input circuit, a second input circuit, an output circuit and a pull-up node reset circuit; wherein the first input circuit is connected with a first signal terminal, a first voltage terminal and a pull-up node, and configured for outputting a voltage of the first voltage terminal to the pull-up node under a control of the first signal terminal; the second input circuit is connected with a second signal terminal, a second voltage terminal and the pull-up node, and configured for outputting a voltage of the second voltage terminal to the pull-up node under a control of the second signal terminal; the output circuit is connected with a clock signal terminal, the pull-up node and a signal output terminal, and configured for outputting a clock signal of the clock signal terminal to the signal output terminal under a control of the pull-up node; the pull-up node reset circuit is connected with a third signal terminal, a third voltage terminal and the pull-up node, and configured for outputting a voltage of the third voltage terminal to the pull-up node under a control of the third signal terminal.

For example, the shift register unit according to an embodiment of the present disclosure further comprises a signal output terminal reset circuit; wherein the signal output terminal reset circuit is connected with the third signal terminal, the third voltage terminal, and the signal output terminal, and configured for outputting a voltage of the third voltage terminal to the signal output terminal under a control of the third signal terminal.

For example, the shift register unit according to an embodiment of the present disclosure further comprises a pull-down control circuit, a pull-down circuit and a noise reduction circuit; wherein the pull-down control circuit is connected with the third voltage terminal, the fourth voltage terminal, the pull-up node and the pull-down node, and configured for controlling a level of the pull-down node; the pull-down circuit is connected with the pull-down node, the third voltage terminal and the signal output terminal, and configured for outputting a voltage of the third voltage terminal to the signal output terminal under a control of the pull-down node; the noise reduction circuit is connected with the pull-down node, the third voltage terminal and the pull-up node, and configured for outputting a voltage of the third voltage terminal to the pull-up node under a control of the pull-down node.

For example, in the shift register unit according to an embodiment of the present disclosure, the pull-up node reset circuit comprises a first transistor; a gate of the first transistor is connected with the third signal terminal, a first electrode of the first transistor is connected with the third voltage terminal and a second electrode of the first transistor is connected with the pull-up node.

For example, in the shift register unit according to an embodiment of the present disclosure, the signal output terminal reset circuit comprises a second transistor; a gate of the second transistor is connected with the third signal terminal, a first electrode of the second transistor is connected with the third voltage terminal and a second electrode of the second transistor is connected with the signal output terminal.

For example, in the shift register unit according to an embodiment of the present disclosure, the first input circuit comprises a third transistor; a gate of the third transistor is connected with the first signal terminal, a first electrode of the third transistor is connected with the first voltage terminal and a second electrode of the third transistor is connected with the pull-up node.

For example, in the shift register unit according to an embodiment of the present disclosure, the second input circuit comprises a fourth transistor; a gate of the fourth transistor is connected with the second signal terminal, a first electrode of the fourth transistor is connected with the second voltage terminal and a second electrode of the fourth transistor is connected with the pull-up node.

For example, in the shift register unit according to an embodiment of the present disclosure, the output circuit comprises a fifth transistor and a capacitor; a gate of the fifth transistor is connected with the pull-up node, a first electrode of the fifth transistor is connected with the clock signal terminal and a second electrode of the fifth transistor is connected with the signal output terminal and a second terminal of the capacitor; a first terminal of the capacitor is connected with the pull-up node, and the second terminal of the capacitor is further connected with the signal output terminal.

For example, in the shift register unit according to an embodiment of the present disclosure, the pull-down control circuit comprises a sixth transistor and a seventh transistor; a gate of the sixth transistor is connected with the fourth voltage terminal, a first electrode of the sixth transistor is connected with the fourth voltage terminal, and a second electrode of the sixth transistor is connected with the pull-down node; a gate of the seventh transistor is connected with the pull-up node, a first electrode of the seventh transistor is connected with the third voltage terminal, and a second electrode of the seventh transistor is connected with the pull-down node.

For example, in the shift register unit according to an embodiment of the present disclosure, the pull-down control circuit further comprises an eighth transistor and a ninth transistor; a gate of the eighth transistor is connected with the fourth voltage terminal, a first electrode of the eighth transistor is connected with the fourth voltage terminal, and a second electrode of the eighth transistor is connected with the gate of the sixth transistor; a gate of the ninth transistor is connected with the pull-up node, a first electrode of the ninth transistor is connected with the third voltage terminal, and a second electrode of the ninth transistor is connected with the gate of the sixth transistor.

For example, in the shift register unit according to an embodiment of the present disclosure, the pull-down circuit comprises a tenth transistor; a gate of the tenth transistor is connected with the pull-down node, a first electrode of the tenth transistor is connected with the third voltage terminal, and a second electrode of the tenth transistor is connected with the signal output terminal.

For example, in the shift register unit according to an embodiment of the present disclosure, the noise reduction circuit comprises an eleventh transistor; a gate of the eleventh transistor is connected with the pull-down node, a first electrode of the eleventh transistor is connected with the third voltage terminal, and a second electrode of the eleventh transistor is connected with the pull-up node.

At least one embodiment of the present disclosure further provides a scan driving circuit, comprising at least two cascaded stages of shift register units as mentioned above; the first signal terminal of the shift register unit at a first stage is connected with a start signal terminal; except the shift register unit at the first stage, the first signal terminal of the shift register unit at a stage is connected with the signal output terminal of the shift register unit at a previous stage; except the shift register unit at a last stage, the second signal terminal of the shift register unit at a stage is connected with the signal output terminal of the shift register unit at a next stage; the second signal terminal of the shift register unit at the last stage is connected with the start signal terminal.

At least one embodiment of the present disclosure further provides a display device, comprising any one of the above-mentioned gate driving circuits.

At least one embodiment of the present disclosure further provides a method of driving any one of the above-mentioned shift register units, which comprising: an input phase: outputting by the first input circuit a voltage of the first voltage terminal to the pull-up node, under a control of the first signal terminal; an output phase: outputting by the output circuit the clock signal of the clock signal terminal to the signal output terminal which outputs a gate scan signal, under a control of the pull-up node.

For example, in the driving method according to an embodiment of the present disclosure, the shift register unit further comprises a pull-down control circuit, a pull-down circuit, and a noise reduction circuit, the driving method further comprises: a pull-down phase: outputting by the second input circuit a voltage of the second voltage terminal to the pull-up node under a control of the second signal terminal, so as to control the output circuit to be turned off; outputting by the pull-down control circuit a voltage of a fourth voltage terminal to a pull-down node under a control of the pull-up node; outputting by the pull-down circuit a voltage of the third voltage terminal to the signal output terminal, and outputting by the noise reduction circuit a voltage of the third voltage terminal to the pull-up node, under a control of the pull-down node.

For example, the driving method according to an embodiment of the present disclosure further comprises: a reset phase: outputting by the pull-up node reset circuit a voltage of the third voltage terminal to the pull-up node under a control of the third signal terminal.

At least one embodiment of the present disclosure further provides a method of driving any one of the above-mentioned gate driving circuits, which comprising: during a scan phase of a frame: receiving by the shift register unit at the first stage of the gate driving circuit a start signal of the start signal terminal, and turning on the shift register units in the gate driving circuit stage by stage; during a field blanking phase of the frame: outputting a voltage of the third voltage terminal to the pull-up node of each of the cascaded shift register units under a control of the third signal terminal, so as to reset the pull-up node of each of the cascaded shift register units.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 2($b$) is a schematic structural diagram of another shift register unit according to some embodiments of the present disclosure;

Figure 1:
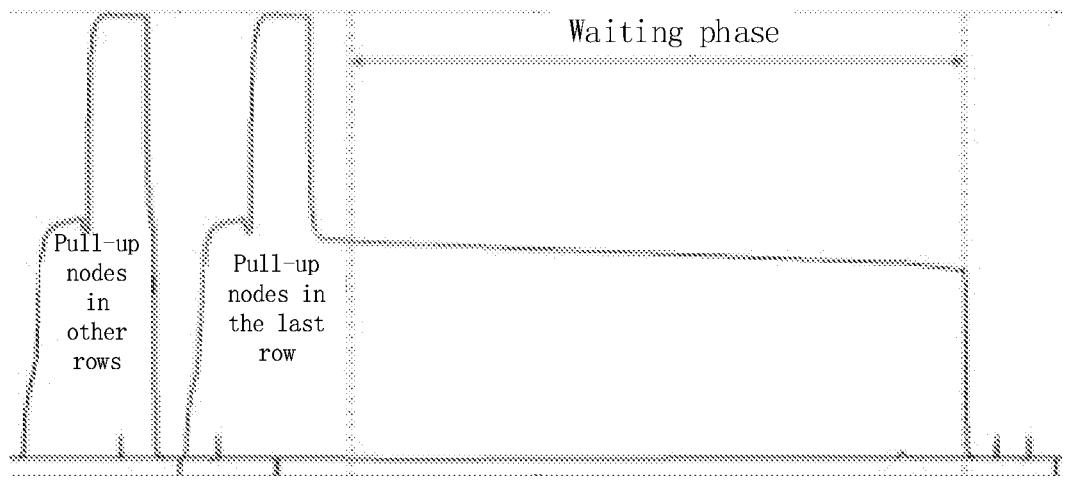
FIG. 1 is a schematic waveform diagram of a pull-up node in a gate driving circuit.

Reference numerals: 10—first input circuit; 20—second input circuit; 30—output circuit; 40—pull-up node reset circuit; 50—signal output terminal reset circuit; 60—pull-down control circuit; 70—pull-down circuit; 80—noise reduction circuit; IN1—first signal terminal; IN2—second signal terminal; IN3—third signal terminal; CLK—clock signal terminal; OUTPUT—signal output terminal; V1—first voltage terminal; V2—second voltage terminal; V3—third voltage terminal; V4—fourth voltage terminal; PU—pull-up node; PD—pull-down node; C—capacitor

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

FIG. 1 is a schematic waveform diagram of a pull-up node in a gate driving circuit. For example, one frame may be divided into a display phase and a field blanking phase (the time of the field blanking phase is shorter than that of the display phase). In the gate driving circuit, a pull-up node of the shift register unit at each stage is pulled down under the control of an output signal of the shift register unit at the next stage, and the pull-up node of the shift register unit at the last stage is pulled down under the control of a start signal of the next frame. In the schematic waveform diagram of the pull-up node as shown in FIG. 1, the time for which the pull-up nodes of the shift register units at the last row are maintained at a high level is much longer than the time for which the pull-up nodes of the shift register units at other rows are maintained at a high level, so the working time of the transistors in the output circuits of the shift register units at the last row are much longer than the working time of the transistors in the output circuits of the shift register units at other rows. With an increase in the working time, the threshold voltage drifts of the transistors in the output circuits of the shift register units at the last row are more serious than those of the transistors in the output circuit of the shift register units at other rows. In case of a reverse scan, the last row of shift register units is taken as the first row. Due to the serious threshold voltage drift, an output voltage of the shift register units at this row is lower than that of a normal gate driving signal. Therefore, a dark line appears on the display screen due to a relatively low display brightness, and finally a user may see a plurality of dark lines on the display screen, which influences display effects.

The embodiments of the present disclosure provide a shift register unit, a gate driving circuit and a driving method thereof, and a display device, which can solve the problem of dark lines on the display screen due to the threshold voltage drift of the transistor.

Figure 2A:
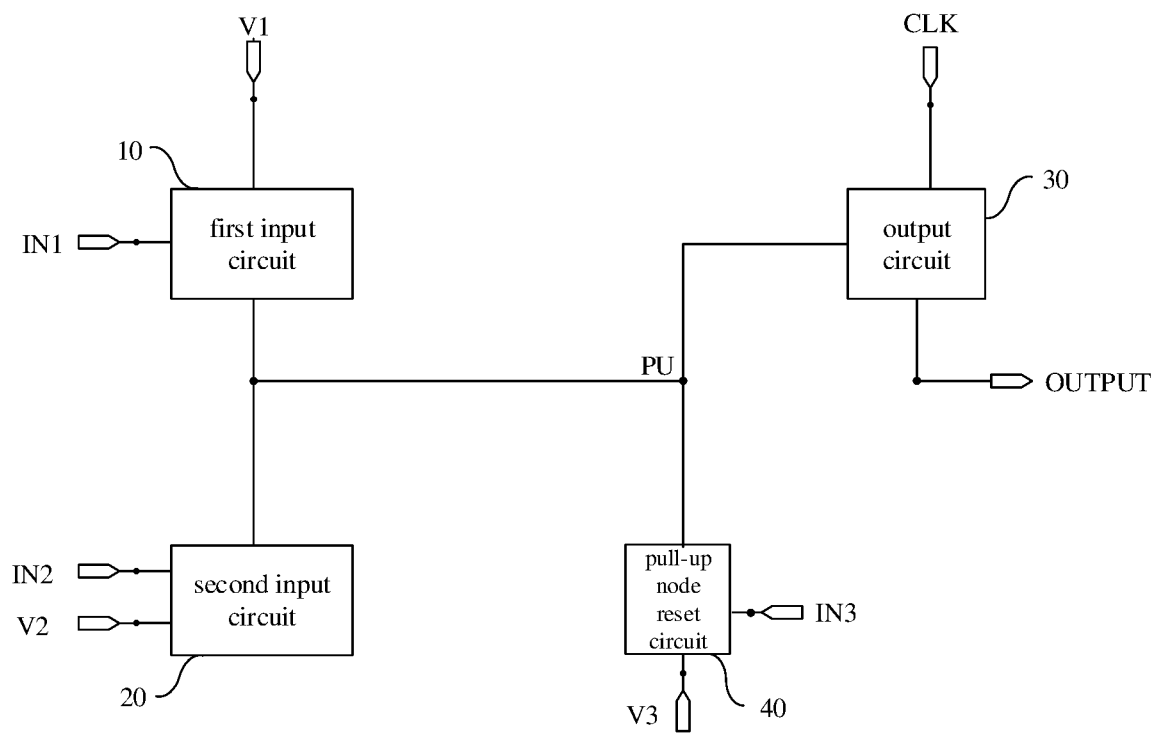
FIG. 2($a$) is a schematic structural diagram of a shift register unit according to an embodiment of the present disclosure.
Figure 2B:
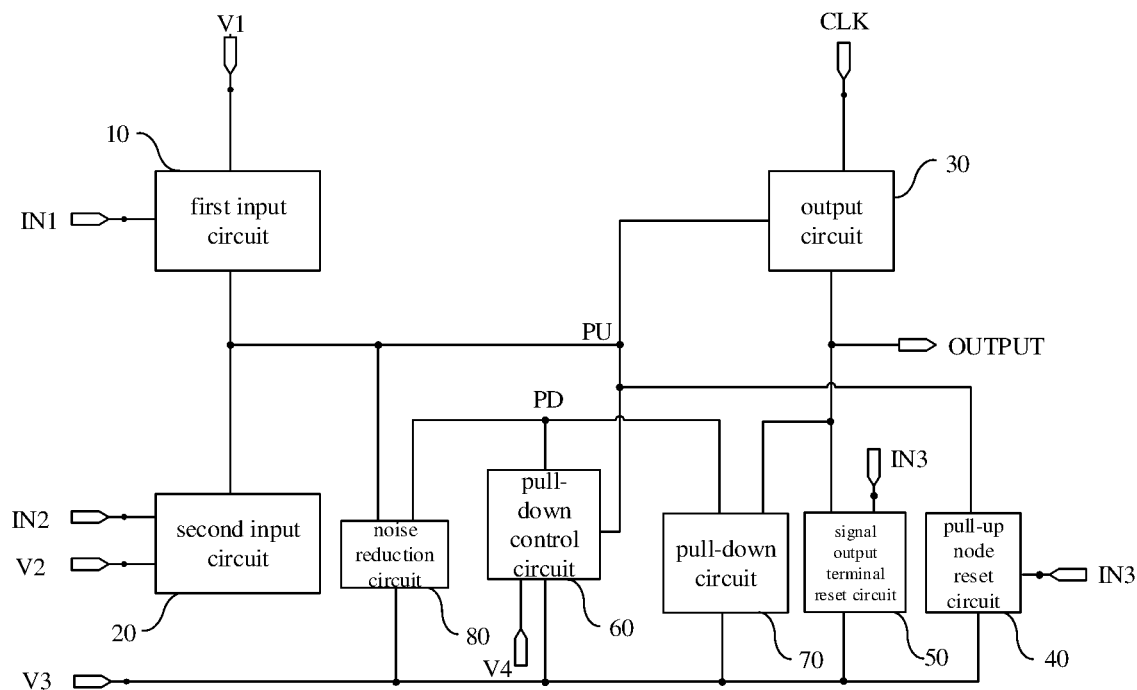

The embodiments of the present disclosure provide a shift register unit. FIG. 2(a) is a schematic structural diagram of a shift register unit according to an embodiment of the present disclosure; FIG. 2(b) is a schematic structural diagram of another shift register unit according to some embodiments of the present disclosure. For example, as shown in FIG. 2(a), the shift register unit may include a first input circuit 10, a second input circuit 20, an output circuit 30 and a pull-up node reset circuit 40.

The first input circuit 10 is connected with a first signal terminal IN1, a first voltage terminal V1, and the pull-up node PU, and configured for outputting a voltage of the first voltage terminal V1 to the pull-up node PU under the control of the first signal terminal IN1.

The second input circuit 20 is connected with a second signal terminal IN2, a second voltage terminal V2, and the pull-up node PU, and configured for outputting a voltage of the second voltage terminal V2 to the pull-up node PU under the control of the second signal terminal IN2.

The output circuit 30 is connected with a clock signal terminal CLK, the pull-up node PU, and a signal output terminal OUTPUT, and configured for outputting a clock signal of the clock signal terminal CLK to the signal output terminal OUTPUT under the control of the pull-up node PU.

The pull-up node reset circuit 40 is connected with a third signal terminal IN3, a third voltage terminal V3, and the pull-up node PU, and configured for outputting a voltage of the third voltage terminal V3 to the pull-up node PU under the control of the third signal terminal IN3.

The shift register unit according to the embodiments of the present disclosure additionally includes the pull-up node reset circuit 40, and controls the pull-up node reset circuit 40 to turn on after the signal output terminal outputs a gate scan signal, and the pull-up node reset circuit 40 outputs a low-level signal to the pull-up node, so as to turn off the output circuit 30. For the shift register unit at the last stage, it is not necessary for its output circuit 30 to be turned off under the control of the pull-up node reset circuit 40 until the next frame starts, thereby shortening the working time of the output circuit 30.

It should be noted that a potential of the signal output terminal OUTPUT may be reset by a low level input by the clock signal terminal CLK.

For example, as shown in FIG. 2(b), the shift register unit further includes a signal output terminal reset circuit 50.

The signal output terminal reset circuit 50 is connected with the third signal terminal IN3, the third voltage terminal V3, and the signal output terminal OUTPUT, and configured for outputting a voltage of the third voltage terminal V3 to the signal output terminal OUTPUT under the control of the third signal terminal IN3.

For example, as shown in FIG. 2(b), the shift register unit further includes a pull-down control circuit 60, a pull-down circuit 70 and a noise reduction circuit 80.

The pull-down control circuit 60 is connected with the third voltage terminal V3, a fourth voltage terminal V4, the pull-up node PU and a pull-down node PD, and configured for controlling the level of the pull-down node PD. For example, in some examples, the pull-down control circuit 60 is configured to output the voltage of the third voltage terminal V3 to the pull-down node PD under the control of the pull-up node PU; or, in some other examples, the pull-down control circuit 60 is configured to output the voltage of the fourth voltage terminal V4 to the pull-down node PD under the control of the pull-up node PU.

The pull-down circuit 70 is connected with the pull-down node PD, the third voltage terminal V3, and the signal output terminal OUTPUT, and configured for outputting the voltage of the third voltage terminal V3 to the signal output terminal OUTPUT under the control of the pull-down node PD.

The noise reduction circuit 80 is connected with the pull-down node PD, the third voltage terminal V3, and the pull-up node PU, and configured for outputting the voltage of the third voltage terminal V3 to the pull-up node PU under the control of the pull-down node PD.

The pull-down control circuit 60 may control the potential of the pull-down node PD, such that the pull-down node PD may control the noise reduction circuit 80 to pull down the potential of the pull-up node PU to the potential of the voltage output by the third voltage terminal V3, thereby reducing the noise at the pull-up node PU.

It should be noted that in the embodiments of the present disclosure, the signal output from the above-mentioned first signal terminal IN1 has an opposite phase to the signal output from the second signal terminal IN2. That is, if the signal output from the first signal terminal IN1 is at a high level, the signal output from the second signal terminal IN2 is at a low level; if the signal output from the first signal terminal IN1 is at a low level, the signal output from the second signal terminal IN2 is at a high level. In addition, as an example, in the following embodiments, a first power voltage output from the first voltage terminal V1 is a high-level signal, a second power voltage output from the second voltage terminal V2 and a third power voltage output from the third voltage terminal V3 are low-level signals, or the second voltage terminal V2 and the third voltage terminal V3 are grounded.

On one hand, the first input circuit 10 outputs the voltage of the first voltage terminal V1 to the pull-up node PU under the control of the first signal terminal IN1. In addition, the second input circuit 20 may output the voltage of the second voltage terminal V2 to the pull-up node PU under the control of the second signal terminal IN2. In this case, when this shift register unit adopts a forward scan, the first power voltage output from the first voltage terminal V1 is a high-level signal, the second power voltage output from the second voltage terminal V2 is a low-level signal, the voltage of the first voltage terminal V1 is used for charging the pull-up node PU, and the voltage of the second voltage terminal V2 is used for resetting the pull-up node PU. When this shift register unit adopts a reverse scan, the first power voltage output from the first voltage terminal V1 is a low-level signal, the second power voltage output from the second voltage terminal V2 is a high-level signal, the voltage of the second voltage terminal V2 is used for charging the pull-up node PU, and the voltage of the first voltage terminal V1 is used for resetting the pull-up node PU.

Based on this, after the pull-up node PU is charged, the output circuit 30 outputs the clock signal of the clock signal terminal CLK to the signal output terminal OUTPUT under the control of this pull-up node PU, such that the signal output terminal OUTPUT may output the gate scan signal to the gate connected with this signal output terminal OUTPUT at the output phase. Under the control of the second signal terminal IN2, the second input circuit 20 outputs the voltage of the second voltage terminal V2 to the pull-up node PU, so as to control the potential of the pull-down node PD by the pull-down control circuit 60, such that the pull-down circuit 70 pulls down the potential of the signal output terminal OUTPUT to the potential of the third voltage terminal V3 under the control of the pull-down node PD.

On the other hand, the pull-up node reset circuit 40 may pull down the potential of the pull-up node PU to the potential of the third voltage terminal V3 under the control of the third signal terminal IN3, so as to control the output circuit 30 to switch off; the signal output terminal reset circuit 50 may pull down the potential of the signal output terminal OUTPUT to the potential of the third voltage terminal V3 under the control of the third signal terminal IN3.

In this way, by arranging the pull-up node reset circuit 40, after the signal output terminal outputs the gate scan signal, the pull-up node reset circuit 40 is controlled to turn on, and the pull-up node reset circuit 40 outputs a low-level signal to the pull-up node, so as to turn off the output circuit 30. For the shift register unit at the last stage, it is not necessary for its output circuit 30 to be turned off under the control of the pull-up node reset circuit 40 until the next frame starts, thereby shortening the working time of the output circuit 30 of the shift register unit at the last stage. In addition, for each shift register unit, before the start of the next frame, a low potential may be output to the signal output terminal OUTPUT by the signal output terminal reset circuit 50, thereby reducing the noise of the shift register unit.

In the following, the specific structure of each circuit in the above-mentioned shift register unit will be explained in detail.

Figure 3:
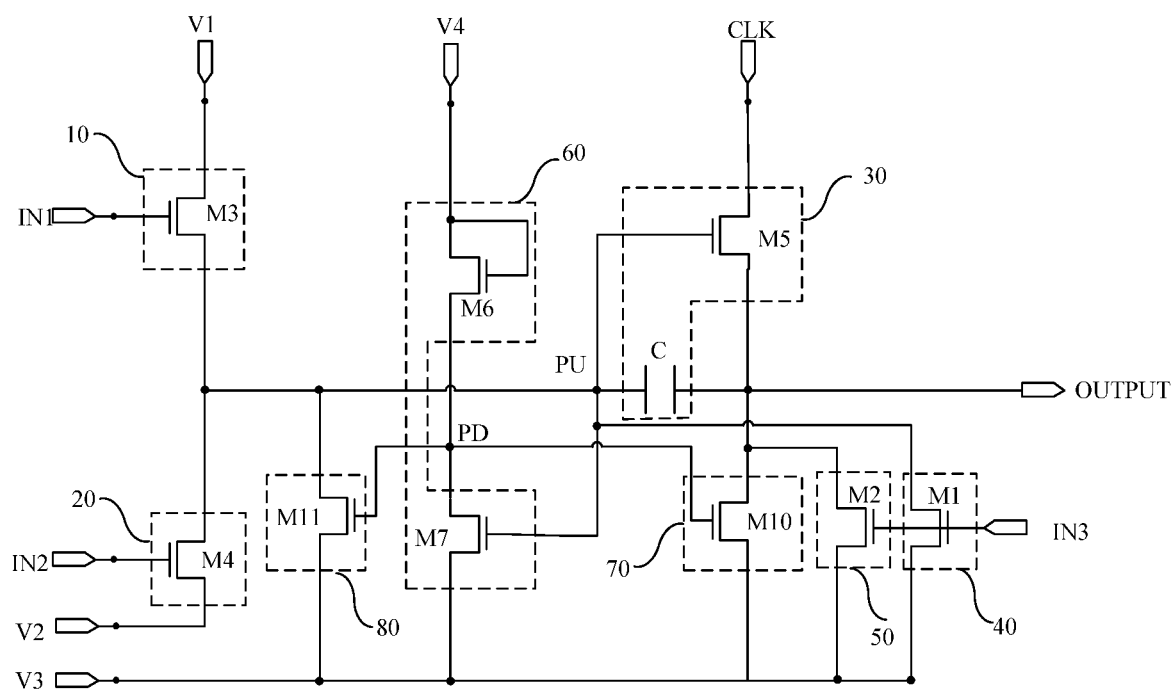
FIG. 3 is a schematic diagram of a specific structure of each circuit in FIG. 2($b$)
Figure 4:
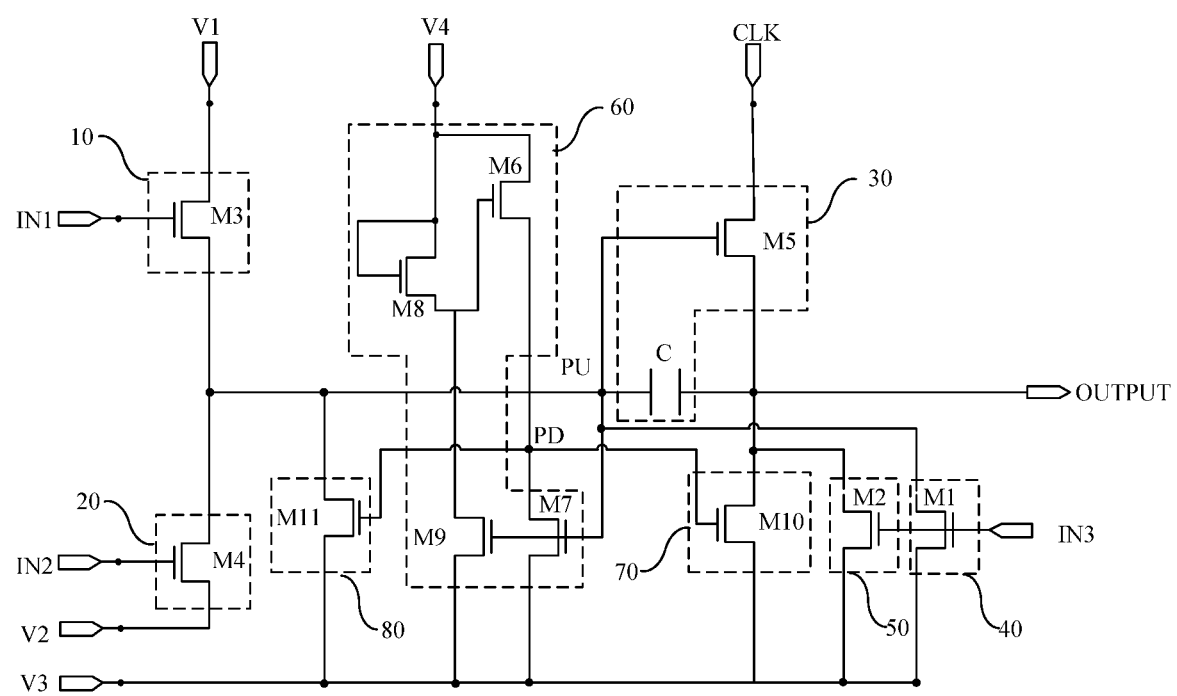
FIG. 4 is a schematic diagram of another specific structure of each circuit in FIG. 2($b$)

For example, as shown in FIGS. 3 and 4, the pull-up node reset circuit 40 includes a first transistor M1. A gate of the first transistor M1 is connected with the third signal terminal IN3, a first electrode of the first transistor M1 is connected with the third voltage terminal V3 and a second electrode of the first transistor M1 is connected with the pull-up node PU.

For example, as shown in FIGS. 3 and 4, the signal output terminal reset circuit 50 includes a second transistor M2. A gate of the second transistor M2 is connected with the third signal terminal IN3, a first electrode of the second transistor M2 is connected with the third voltage terminal V3 and a second electrode of the second transistor M2 is connected with the signal output terminal OUTPUT.

For example, as shown in FIGS. 3 and 4, the first input circuit 10 includes a third transistor M3. A gate of the third transistor M3 is connected with the first signal terminal IN1, a first electrode of the third transistor M3 is connected with the first voltage terminal V1 and a second electrode of the third transistor M3 is connected with the pull-up node PU.

For example, as shown in FIGS. 3 and 4, the second input circuit 20 includes a fourth transistor M4. A gate of the fourth transistor M4 is connected with the second signal terminal IN2, a first electrode of the fourth transistor M4 is connected with the second voltage terminal V2 and a second electrode of the fourth transistor M4 is connected with the pull-up node PU.

For example, as shown in FIGS. 3 and 4, the output circuit 30 includes a fifth transistor M5 and a capacitor C. A gate of the fifth transistor M5 is connected with the pull-up node PU, a first electrode of the fifth transistor M5 is connected with the clock signal terminal CLK and a second electrode of the fifth transistor M5 is connected with the signal output terminal OUTPUT and a second terminal of the capacitor C. A first terminal of the capacitor C is connected with the pull-up node PU, and the second terminal of the capacitor C is further connected with the signal output terminal OUTPUT.

For example, as shown in FIG. 3, in some embodiments, the pull-down control circuit 60 includes a sixth transistor M6 and a seventh transistor M7. A gate of the sixth transistor M6 is connected with the fourth voltage terminal M4, a first electrode of the sixth transistor M6 is connected with the fourth voltage terminal V4, and a second electrode of the sixth transistor M6 is connected with the pull-down node PD. A gate of the seventh transistor M7 is connected with the pull-up node PU, a first electrode of the seventh transistor M7 is connected with the third voltage terminal V3, and a second electrode of the seventh transistor M7 is connected with the pull-down node PD.

For example, as shown in FIG. 4, in some other embodiments, the pull-down control circuit 60 further includes an eighth transistor M8 and a ninth transistor M9. A gate of the eighth transistor M8 is connected with the fourth voltage terminal M4, a first electrode of the eighth transistor M8 is connected with the fourth voltage terminal V4, and a second electrode of the eighth transistor M8 is connected with the gate of the sixth transistor M6. A gate of the ninth transistor M9 is connected with the pull-up node PU, a first electrode of the ninth transistor M9 is connected with the third voltage terminal V3, and a second electrode of the ninth transistor M9 is connected with the gate of the sixth transistor M6.

For example, as shown in FIGS. 3 and 4, the pull-down circuit 70 includes a tenth transistor M10. A gate of the tenth transistor M10 is connected with the pull-down node PD, a first electrode of the tenth transistor M10 is connected with the third voltage terminal V3, and a second electrode of the tenth transistor M10 is connected with the signal output terminal OUTPUT.

For example, as shown in FIGS. 3 and 4, the noise reduction circuit 80 includes an eleventh transistor M11. A gate of the eleventh transistor M11 is connected with the pull-down node PD, a first electrode of the eleventh transistor M11 is connected with the third voltage terminal V3, and a second electrode of the eleventh transistor M11 is connected with the pull-up node PU.

It should be noted that the transistors in the embodiments of the present disclosures may each be a thin film transistor, a field effect transistor or a switching device with identical characteristics. The source and the drain of the transistor used herein are symmetrical structurally, so they may be the same structurally. In the embodiments of the present disclosure, in order to distinguish the drain from the source of the transistor, one of the drain and the source is referred to as a first electrode, and the other is referred to as a second electrode, so the first and second electrodes of all or part of the transistors in the embodiments of the present disclosure may be interchanged as required. The first electrode of the above-mentioned transistor may be the source, the second electrode may be the drain, or the first electrode of the above-mentioned transistor may be the drain, and the second electrode is the source, which is not limited in the present disclosure. The above-mentioned transistor may be an N-type transistor, a P-type transistor, an enhanced-type transistor, or a depletion-type transistor. For the sake of clarity, in the embodiments of the present disclosure, the technical solution of the present disclosure is explained in detail by taking the N-type transistor as an example. However, the transistor according to the embodiments of the present disclosure is not limited to N type, and persons skilled in the art may also implement functions of one or more transistors according to the embodiments in the present disclosure using the P-type transistor as required.

Figure 5:
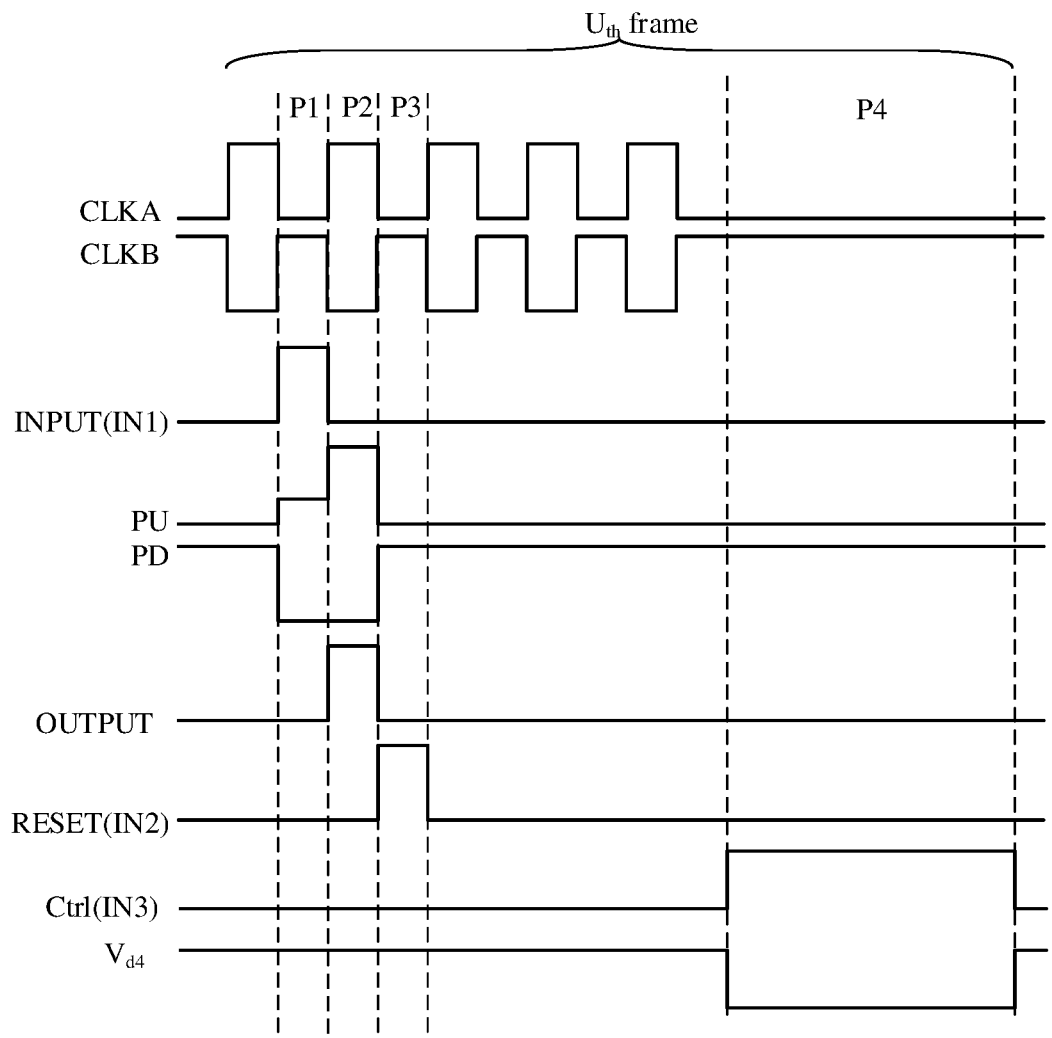
FIG. 5 is a signal timing diagram of controlling the shift register unit shown in FIG. 3 or 4.

FIG. 3 is a schematic diagram of a specific structure of each circuit in FIG. 2(b); FIG. 4 is a schematic diagram of another specific structure of each circuit in FIG. 2(b); FIG. 5 is a signal timing diagram of controlling the shift register unit shown in FIG. 3 or 4. In the following, different stages of the shift register unit shown in FIGS. 3 and 4 will be explained in detail in combination with the signal timing diagram shown in FIG. 5. As an example, in the embodiments of the present disclosure, a first power voltage output from the first voltage terminal V1 is a high-level signal, and a second power voltage output from the second voltage terminal V2 and a third power voltage output from the third voltage terminal V3 are low-level signals. In addition, the following description is made by taking the signal output from the first signal terminal IN1 as an input signal INPUT and the signal output from the second signal terminal IN2 as a reset signal RESET. It should be noted that in the following description, "1" represents a high-level signal, and "0" represents a low-level signal.

For example, as shown in FIG. 5, in the Uth frame, at the input phase P1, the input signal INPUT is a high-level signal, the reset signal RESET is a low-level signal, the clock signal CLKA output from the clock signal terminal CLK is a low-level signal, the pull-up node reset signal Ctrl output from the third signal terminal IN3 is a low-level signal, and the fourth power voltage $V_{d4}$ output from the fourth voltage terminal V4 is a high-level signal, i.e., INPUT=1, RESET=0, CLKA=0, Ctrl=0, $V_{d4}$=1.

At this point, since the first signal terminal IN1 outputs a high-level signal, the third transistor M3 is turned on, thereby outputting the first power voltage with a high level output from the first voltage terminal V1 to the pull-up node PU, so the voltage of the pull-up node PU is a high-level signal. Under the control of the high-level pull-up node PU, the fifth transistor M5 is turned on, thereby outputting the clock signal CLKA with a low level of the clock signal terminal CLK to the signal output terminal OUTPUT.

For example, as shown in FIG. 3, under the control of the high potential of the pull-up node PU, the seventh transistor M7 is turned on. Under the control of the high-level fourth power voltage $V_{d4}$ output from the fourth voltage terminal V4, the sixth transistor M6 is turned on. However, since a width to length ratio of a channel of the seventh transistor M7 is greater than that of the channel of the sixth transistor M6, the potential of the pull-down node PD is still pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

For example, as shown in FIG. 4, under the control of the high potential of the pull-up node PU, the seventh transistor M7 and the ninth transistor M9 are turned on. Under the control of the high-level fourth power voltage $V_{d4}$ output from the fourth voltage terminal V4, the eighth transistor M8 is turned on. However, since a width to length ratio of a channel of the ninth transistor M9 is greater than that of the channel of the eighth transistor M8, the gate of the sixth transistor M6 is at a low level, thereby controlling the sixth transistor M6 to be turned off. The potential of the pull-down node PD is pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

In addition, the third signal terminal IN3 outputs a low-level signal, such that the first transistor M1 and the second transistor M2 are both turned off; the second signal terminal IN2 outputs a low-level signal, such that the fourth transistor M4 is turned off.

To sum up, the signal output terminal OUTPUT outputs a low level at the above-mentioned input phase P1.

For example, as shown in FIG. 5, at the output phase P2, the input signal INPUT is a low-level signal, the reset signal RESET is a low-level signal, the clock signal CLKA output from the clock signal terminal CLK is a high-level signal, the pull-up node reset signal Ctrl output from the third signal terminal IN3 is a low-level signal, and the fourth power voltage $V_{d4}$ output from the fourth voltage terminal V4 is a high-level signal, i.e., INPUT=0, RESET=0, CLKA=1, Ctrl=0, $V_{d4}$=1.

At this point, since the first signal terminal IN1 outputs a low-level signal, the third transistor M3 is turned off. Due to the maintenance of the capacitor C, the capacitor C keeps charging the pull-up node PU, such that the fifth transistor M5 is kept turned on. In this case, the high-level clock signal CLKA output from the clock signal terminal CLK is output to the signal output terminal OUTPUT by the fifth transistor M5. At this point, under the action of the bootstrapping of the capacitor C, the potential of the pull-up node PU further rises (the potential of one terminal of the capacitor C connected with the signal output terminal OUTPUT is jumped to 1 from 0; when the capacitor C charges the pull-up node PU, the potential of the pull-up node PU is jumped toward a high level by 1 on the basis of 1), so as to keep the fifth transistor M5 turned on, such that the clock signal CLKA output from the clock signal terminal CLK may be output to the gate line connected with the signal output terminal OUTPUT, as the gate scan signal.

For example, as shown in FIG. 3, under the control of the high potential of the pull-up node PU, the seventh transistor M7 is turned on. Under the control of the high-level fourth power voltage $V_{d4}$ output from the fourth voltage terminal V4, the sixth transistor M6 is turned on. However, since a width to length ratio of a channel of the seventh transistor M7 is greater than that of the channel of the sixth transistor M6, the potential of the pull-down node PD is still pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

For example, as shown in FIG. 4, under the control of the high potential of the pull-up node PU, the seventh transistor M7 and the ninth transistor M9 are turned on. Under the control of the high-level fourth power voltage $V_{d4}$ output from the fourth voltage terminal V4, the eighth transistor M8 is turned on. However, since a width to length ratio of a channel of the ninth transistor M9 is greater than that of the channel of the eighth transistor M8, the gate of the sixth transistor M6 is at a low level, thereby controlling the sixth transistor M6 to be turned off. The potential of the pull-down node PD is pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

In addition, the third signal terminal IN3 outputs a low-level signal, such that the first transistor M1 and the second transistor M2 are both turned off; the second signal terminal IN2 outputs a low-level signal, such that the fourth transistor M4 is turned off.

To sum up, the signal output terminal OUTPUT outputs a high level at the above-mentioned output phase P2, so as to output the gate scan signal to the gate line connected with the signal output terminal OUTPUT.

For example, as shown in FIG. 5, at the pull-down phase P3, the input signal INPUT is a low-level signal, the reset signal RESET is a high-level signal, the clock signal CLKA output from the clock signal terminal CLK is a low-level signal, the pull-up node reset signal Ctrl output from the third signal terminal IN3 is a low-level signal, and the fourth power voltage $V_{d4}$ output from the fourth voltage terminal V4 is a high-level signal, i.e., INPUT=0, RESET=1, CLKA=0, Ctrl=0, $V_{d4}$=1.

At this point, since the second signal terminal IN2 outputs a high-level signal, the fourth transistor M4 is turned on, the potential of the pull-up node PU is pulled down to the second power voltage output from the second voltage terminal V2, thereby turning off the fifth transistor M5.

For example, as shown in FIG. 3, under the control of the low potential of the pull-up node PU, the seventh transistor M7 is turned off. Under the control of the fourth power voltage $V_{d4}$ output from the fourth voltage terminal V4, the sixth transistor M6 is turned on, and the fourth power voltage $V_{d4}$ output from the fourth voltage terminal V4 is output to the pull-down node PD. Therefore, the voltage of the pull-down node PD is a high-level signal. Under the control of the high potential of the pull-down node PD, both the tenth transistor M10 and the eleventh transistor M11 are turned on, the potential of the pull-down node PD is pulled down to the third power voltage output from the third voltage terminal V3 by the eleventh transistor M11, and the potential of the signal output terminal OUTPUT is pulled down to the third power voltage output from the third voltage terminal V3 by the tenth transistor M10.

For example, as shown in FIG. 4, under the control of the low potential of the pull-up node PU, the seventh transistor M7 and the ninth transistor M9 are both turned off. Under the control of the fourth power voltage $V_{d4}$ output from the fourth voltage terminal V4, the eighth transistor M8 is turned on, and the fourth power voltage $V_{d4}$ output from the fourth voltage terminal V4 is output to the gate of the sixth transistor M6, to control the sixth transistor to be turned on. The sixth transistor M6 outputs the fourth power voltage $V_{d4}$ output from the fourth voltage terminal V4 to the pull-down node PD. Therefore, the voltage of the pull-down node PD is a high-level signal. Under the control of the high potential of the pull-down node PD, both the tenth transistor M10 and the eleventh transistor M11 are turned on, the potential of the pull-down node PD is pulled down to the third power voltage output from the third voltage terminal V3 by the eleventh transistor M11, and the potential of the signal output terminal OUTPUT is pulled down to the third power voltage output from the third voltage terminal V3 by the tenth transistor M10.

In addition, the first signal terminal IN1 outputs a low-level signal, such that the third transistor M3 is turned off; the third signal terminal IN3 outputs a low-level signal, such that the first transistor M1 and the second transistor M2 is both turned off.

For example, as shown in FIG. 5, at the reset phase P4, the input signal INPUT is a low-level signal, the reset signal RESET is a low-level signal, the pull-up node reset signal Ctrl output from the third signal terminal IN3 is a high-level signal, and the fourth power voltage $V_{d4}$ output from the fourth voltage terminal V4 is a low-level signal, i.e., INPUT=0, RESET=0, Ctrl=1, $V_{d4}$=0.

At this point, the third signal terminal IN3 outputs a high-level signal, thereby turning on the first transistor M1 and the second transistor M2. The first transistor M1 outputs the third power voltage output from the third voltage terminal V3 to the pull-up node PU, so as to reset the pull-up node PU. At this point, the voltage of the pull-up node PU is a low-level signal, and the fifth transistor M5 is turned off; in addition, the second transistor M2 outputs the third power voltage output from the third voltage terminal V3 to the signal output terminal OUTPUT, so as to reset the signal output terminal OUTPUT.

For example, the third signal terminal IN3 may keep outputting a high-level signal during the whole reset phase P4, or outputs a high-level signal at a start and/or an end of the reset phase P4 respectively.

At the reset phase P4, except the first transistor M1 and the second transistor M2 in an ON state, other transistors are turned off.

It should be noted that the working process of the transistor in the above-mentioned embodiments is explained by taking the N-type transistor as an example. In the case that all transistors are of P type, each control signal in FIG. 5 should be inverted, and the working process of the transistor of each circuit in the shift register unit is the same as above, and is not repeated herein.

For example, the working process of the above-mentioned shift register unit is explained by taking the gate driving circuit formed by cascading a plurality of shift register units adopting a forward scan as an example. In case of the reverse scan, in the shift register unit as shown in FIGS. 3 and 4, the first signal terminal IN1 outputs a reset signal RESET, and the second signal terminal IN2 outputs an input signal INPUT. In addition, the above-mentioned first voltage terminal V1 outputs a low-level signal, and the second voltage terminal V2 outputs a high-level signal.

Figure 6:
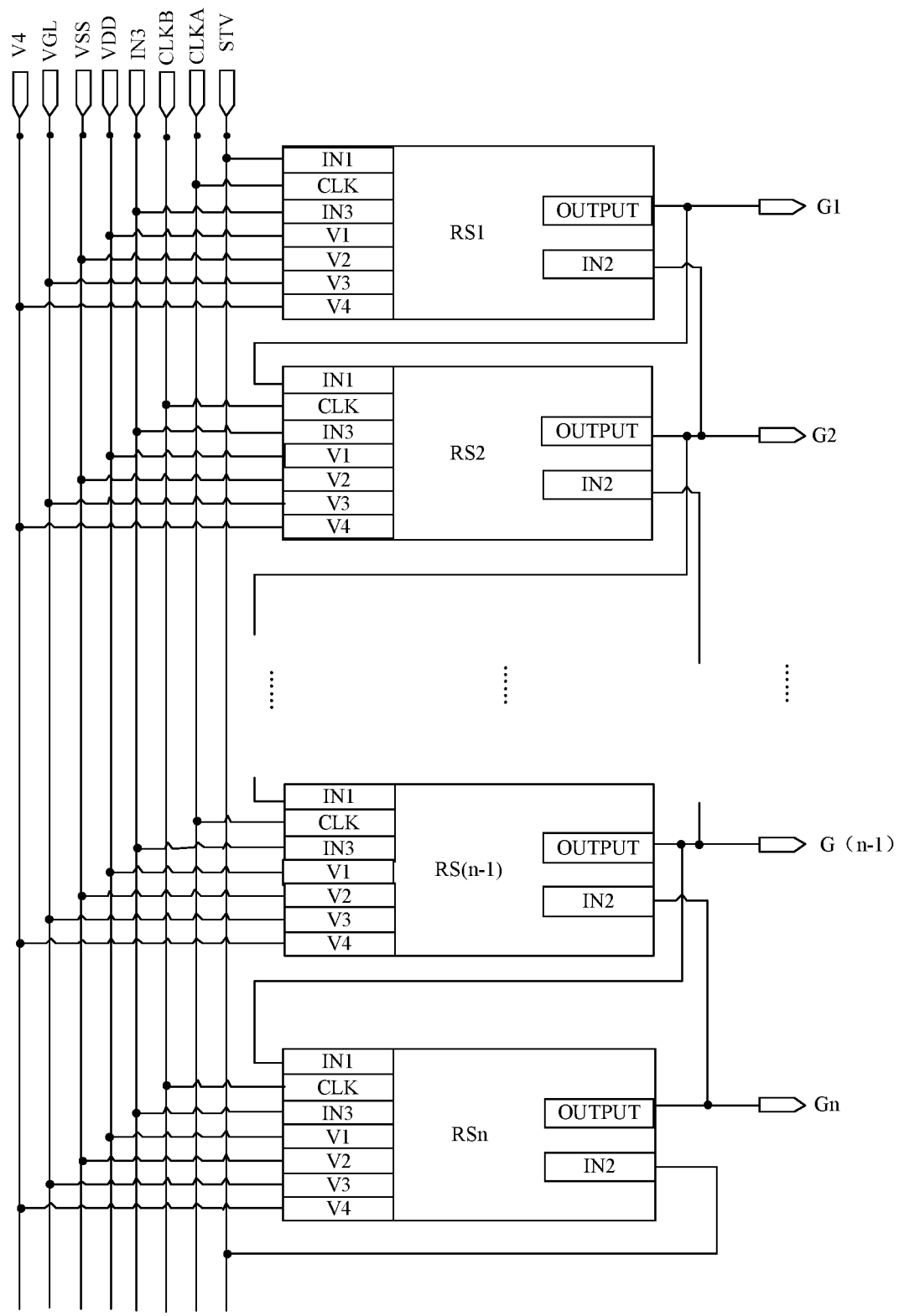
FIG. 6 is a schematic structural diagram of a gate driving circuit according to some embodiments of the present disclosure.

The embodiments of the present disclosure further provide a gate driving circuit, and FIG. 6 is a schematic structural diagram of a gate driving circuit according to some embodiments of the present disclosure. For example, as shown in FIG. 6, the gate driving circuit includes a plurality of cascaded shift register units (RS1, RS2 . . . RSn) according to any one of the above-mentioned embodiments.

For example, the first signal terminal IN1 of the shift register unit RS1 at the first stage is connected with a start signal terminal STV. Except the shift register unit RS1 at the first stage, the first signal terminal IN1 of the shift register unit RS (n−1) at a stage is connected with the signal output terminal OUTPUT of the shift register unit RS (n−2) at the previous stage. The start signal terminal STV is used for outputting a start signal, and the shift register unit RS1 at the first stage of this gate driving circuit scans gate lines (G1, G2 . . . Gn) progressively after receiving the above-mentioned start signal.

For example, except the shift register unit RSn at the last stage, the second signal terminal IN2 of the shift register unit RS(n−1) at a stage is connected with the signal output terminal OUTPUT of the shift register unit RSn at the next stage, and the second signal terminal IN2 of the shift register unit RSn at the last stage is connected with the above-mentioned start signal terminal STV. When the start signal of the start signal terminal STV is input to the first signal terminal IN1 of the shift register unit RS1 at the first stage, the second signal terminal IN2 of the shift register unit RSn at the last stage may reset the signal output terminal OUTPUT of the shift register unit RSn at the last stage by taking the start signal of the start signal terminal STV as the reset signal.

Based on this, the first voltage terminal V1 of the shift register unit at each stage is connected with a high level VDD, the second voltage terminal V2 is connected with a low level VSS, and the third voltage terminal V3 is connected with a low level VGL.

For example, as shown in FIG. 6, the gate driving circuit provides a first clock signal CLKA and a second clock signal CLKB. The first clock signal CLKA is applied to the clock signal terminal CLK of the shift register unit at the (2N−1)th stage; the second clock signal CLKB is applied to the clock signal terminal CLK of the shift register unit at the (2N)th stage; N is a positive integer, and is greater than or equal to 1.

In addition, the gate driving circuit shown in FIG. 6 shows the way for connecting each control signal when a forward scan is performed on the gate lines. In the case where this gate driving circuit is adopted to perform a reverse scan on the gate lines, the second signal terminal IN2 of the shift register unit RS1 at the first stage is connected with the start signal terminal STV. Except the shift register unit RS1 at the first stage, the second signal terminal IN2 of the shift register unit RS(n−1) at a stage is connected with the signal output terminal OUTPUT of the shift register unit RS(n−2) at the previous stage, and the signal output terminal OUTPUT of the shift register unit RS(n−1) at the stage is connected with the second signal terminal IN2 of the shift register unit RS(n) at the next stage. Except the shift register unit RSn at the last stage, the first signal terminal IN1 of the shift register unit RS(n−1) at a stage is connected with the signal output terminal OUTPUT of the shift register unit RSn at the previous stage. The first signal terminal IN1 of the shift register unit RSn at the last stage is connected with the above-mentioned start signal terminal STV. At this point, the first voltage terminal V1 of the shift register unit at each stage is connected with a low level VSS, the second voltage terminal V2 is connected with a high level VDD, and the third voltage terminal V3 is connected with a low level VGL.

From FIG. 6, each shift register unit in the gate driving circuit is connected with the same third signal terminal IN3. When the third signal terminal IN3 outputs a high-level signal, all the shift register units in the gate driving circuit reset the signal output terminal OUTPUT and the pull-up node PU.

It should be noted that in the present disclosure, the pull-up node reset circuit may be arranged in the shift register unit at the last stage of the gate driving circuit; or the pull-up node reset circuit is arranged in all the shift register units of the gate driving circuit, which is not limited in the present disclosure.

Figure 7:
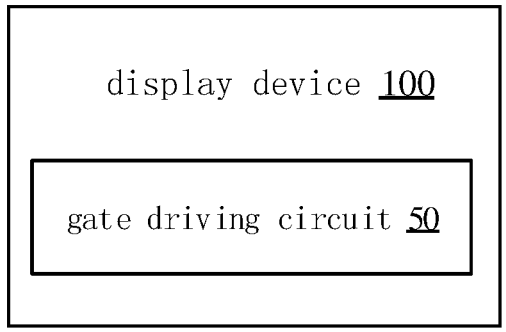
FIG. 7 is a schematic block diagram of a display device according to an embodiment of the present disclosure.

The embodiments of the present disclosure further provide a display device, and FIG. 7 is a schematic block diagram of a display device according to one embodiment of the present disclosure. For example, as shown in FIG. 7, the display device 100 includes any one of the above-mentioned gate driving circuits 50, and this display device 100 has the same advantageous effects as the gate driving circuit according to the above-mentioned embodiments. The structure and the advantageous effects of the gate driving circuit have been described in detail in the above-mentioned embodiments, and those of the display device 100 are not repeated herein.

Figure 8:
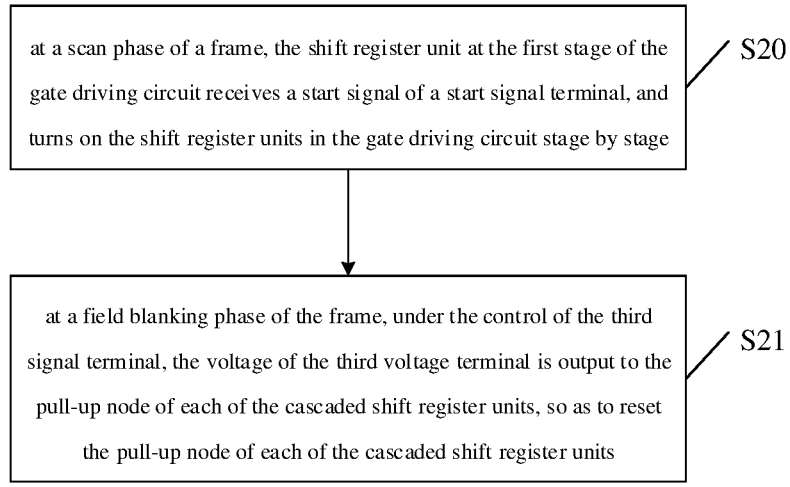
FIG. 8 is a flow chart of a method of driving a gate driving circuit according to an embodiment of the present disclosure.

The embodiments of the present disclosure further provide a method of driving the above-mentioned gate driving circuit, and FIG. 8 is a flow chart of a method of driving a gate driving circuit according to an embodiment of the present disclosure. For example, as shown in FIG. 8, the driving method includes the following steps.

S20: at a scan phase of a frame, the shift register unit at the first stage of the gate driving circuit receives a start signal of a start signal terminal, and turns on the shift register units in the gate driving circuit stage by stage.

Except the shift register unit at the last stage, pulling down the potential of the pull-up node PU of the shift register unit at each stage is carried out by the second input circuit 20 inputting the signal of the third voltage terminal V3 to the pull-up node PU under the control of the second signal terminal IN2; the shift register unit at the last stage outputs the gate scan signal, and then pulling down the potential of the pull-up node PU of the shift register unit at the last stage is carried out by the pull-up node reset circuit 40 inputting the signal of the third voltage terminal V3 to the pull-up node PU under the control of the third signal terminal IN3.

S21: at a field blanking phase of the frame, under the control of the third signal terminal, the voltage of the third voltage terminal is output to the pull-up node of each of the cascaded shift register units, so as to reset the pull-up node of each of the cascaded shift register units.

The method of driving a gate driving circuit according to some embodiments of the present disclosure have the same advantageous effects as the above-mentioned shift register units, and its advantageous effects are not repeated herein.

Figure 9:
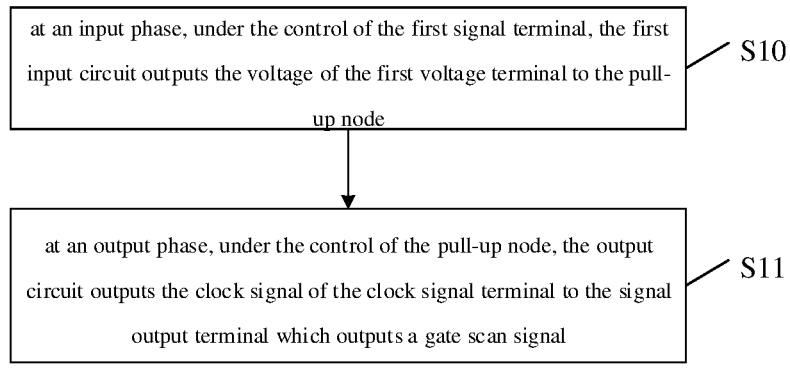
FIG. 9 is a flow chart of a method of driving a shift register unit according to an embodiment of the present disclosure.

The embodiments of the present disclosure further provide a method of driving a shift register unit according to any one of the above-mentioned embodiments, and FIG. 9 is a flow chart of a method of driving a shift register unit according to one embodiment of the present disclosure. For example, as shown in FIG. 9, the driving method includes: S10: at an input phase, under the control of the first signal terminal, the first input circuit outputs the voltage of the first voltage terminal to the pull-up node; S11: at an output phase, under the control of the pull-up node, the output circuit outputs the clock signal of the clock signal terminal to the signal output terminal which outputs a gate scan signal.

For example, as shown in FIG. 5, in step S10, at the input phase P1: under the control of the first signal terminal IN1, the first input circuit 10 outputs the first power voltage of the first voltage terminal V1 to the pull-up node PU. Under the control of the pull-up node PU, the output circuit 30 outputs the clock signal (low-level signal) of the clock signal terminal CLK to the output terminal OUTPUT.

For example, when the structure of each circuit in the above-mentioned shift register unit is as shown in FIG. 3 or 4, and all the transistors in each circuit are N-type transistors, as shown in FIG. 5, at this input phase P1, the clock signal CLKA output from the clock signal terminal CLK is a low-level signal, the first signal terminal IN1 outputs a high-level signal, the second signal terminal IN2 outputs a low-level signal, the third signal terminal IN3 outputs a low-level signal, the fourth voltage terminal V4 outputs a high-level voltage, and the voltage of the pull-up node PU is at a high level. At this point, the signal output terminal OUTPUT outputs a low-level signal.

For example, the first signal terminal IN1 outputs a high-level signal, and thus the first input circuit 10 outputs the first power voltage (high-level signal) output from the first voltage terminal V1 to the pull-up node PU under the control of the high level of the first signal terminal IN1. At the input phase P1, since the first signal terminal IN1 outputs a high-level signal, the third transistor M3 is turned on, thereby outputting the first power voltage output from the first voltage terminal V1 to the pull-up node PU, and thus the voltage of the pull-up node PU is a high-level signal. Under the control of the pull-up node PU, the fifth transistor M5 is turned on, and the low-level clock signal CLKA of the clock signal terminal CLK is output to the signal output terminal OUTPUT.

For example, the third signal terminal IN3 outputs a low-level signal, such that the first transistor M1 and the second transistor M2 are both turned off; the second signal terminal IN2 outputs a low-level signal, such that the fourth transistor M4 is turned off.

For example, as shown in FIG. 5, in step S20, at the output phase P2, under the control of the pull-up node PU, the output circuit 30 outputs the clock signal CLKA (high-level signal) of the clock signal terminal CLK to the signal output terminal OUTPUT, which outputs the gate scan signal.

For example, when the structure of each circuit in the above-mentioned shift register unit is as shown in FIG. 3 or 4, and all the transistors in each circuit are N-type transistors, as shown in FIG. 5, at the output phase P2, the clock signal CLKA output from the clock signal terminal CLK is a high-level signal, the first signal terminal IN1 outputs a low-level signal, the second signal terminal IN2 outputs a low-level signal, the third signal terminal IN3 outputs a low-level signal, the fourth voltage terminal V4 outputs a high-level voltage; the voltage of the pull-up node PU is at a high level. At this point, the signal output terminal OUTPUT outputs a high-level signal.

For example, under the control of the high-level of the pull-up node PU, the output circuit 30 outputs the clock signal CLKA output from the clock signal terminal CLK to the output terminal OUTPUT. At the output phase P2, since the first signal terminal IN1 outputs a low-level signal, the third transistor M3 is turned off. The capacitor C keeps charging the pull-up node PU, such that the fifth transistor M5 is kept turned on. In this case, the high-level clock signal CLKA output from the clock signal terminal CLK is output to the signal output terminal OUTPUT by the fifth transistor M5. In addition, under the action of the bootstrapping of the capacitor C, the potential of the pull-up node PU further rises, so as to keep the fifth transistor M5 turned on, such that the clock signal CLKA output from the clock signal terminal CLK may be output to the gate line connected with the signal output terminal OUTPUT, as the gate scan signal.

For example, the third signal terminal IN3 outputs a low-level signal, such that the first transistor M1 and the second transistor M2 are both turned off; the second signal terminal IN2 outputs a low-level signal, such that the fourth transistor M4 is turned off.

The method of driving a shift register unit according to some embodiments of the present disclosure have the same advantageous effects as the above-mentioned shift register units, and its advantageous effects are not repeated herein.

For example, in some embodiments, the shift register unit further includes a signal output terminal reset circuit 50, a pull-down control circuit 60, a pull-down circuit 70, and a noise reduction circuit 80. As shown in FIG. 5, at the input phase P1, under the control of the first signal terminal IN1, the first input circuit 10 outputs the first power voltage of the first voltage terminal V1 to the pull-up node PU. Under the control of the pull-up node PU, the output circuit 30 outputs the clock signal CLKA (low-level signal) of the clock signal terminal CLK to the signal output terminal OUTPUT.

For example, under the control of the high potential of the pull-up node PU, the pull-down control circuit 60 pulls down the potential of the pull-down node PD to the third power voltage output from the third voltage terminal V3. At this point, none of the second input circuit 20, the pull-down circuit 70, the noise reduction circuit 80, and the pull-up node reset circuit 40 is turned on.

For example, when the structure of each circuit in the above-mentioned shift register unit is as shown in FIG. 3 or 4, and all the transistors in each circuit are N-type transistors, as shown in FIG. 5, at the input phase P1, the clock signal terminal CLK outputs a low-level signal (CLKA), the first signal terminal IN1 outputs a high-level signal, the second signal terminal IN2 outputs a low-level signal, the third signal terminal IN3 outputs a low-level signal, the fourth voltage terminal V4 outputs a high-level voltage, the voltage of the pull-up node PU is at a high level, and the voltage of the pull-down node PD is at a low level. At this point, the signal output terminal OUTPUT outputs a low-level signal.

For example, the first signal terminal IN1 outputs a high-level signal, and the first input circuit 10 outputs the high level of the first voltage terminal V1 to the pull-up node PU under the control of the high-level of the first signal terminal IN1. For example, at the input phase P1, since the first signal terminal IN1 outputs a high-level signal, the third transistor M3 is turned on, thereby outputting the first power voltage output from the first voltage terminal V1 to the pull-up node PU, and the voltage of the pull-up node PU is a high-level signal. Under the control of the pull-up node PU, the fifth transistor M5 is turned on, and the low-level clock signal CLKA of the clock signal terminal CLK is output to the signal output terminal OUTPUT.

For example, as shown in FIG. 3, under the control of the high potential of the pull-up node PU, the seventh transistor M7 is turned on. Under the control of the high-level fourth power voltage output from the fourth voltage terminal V4, the sixth transistor M6 is turned on. However, since a width to length ratio of a channel of the seventh transistor M7 is greater than that of the channel of the sixth transistor M6, the potential of the pull-down node PD is still pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

For example, as shown in FIG. 4, under the control of the high potential of the pull-up node PU, the seventh transistor M7 and the ninth transistor M9 are turned on. Under the control of the high-level fourth power voltage output from the fourth voltage terminal V4, the eighth transistor M8 is turned on. However, since a width to length ratio of a channel of the ninth transistor M9 is greater than that of the channel of the eighth transistor M8, the gate of the sixth transistor M6 is at a low level, thereby controlling the sixth transistor M6 to be turned off. The potential of the pull-down node PD is pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

In addition, the third signal terminal IN3 outputs a low-level signal, such that the first transistor M1 and the second transistor M2 are both turned off; the second signal terminal IN2 outputs a low-level signal, such that the fourth transistor M4 is turned off.

For example, as shown in FIG. 5, at the output phase P2, under the control of the pull-up node PU, the output circuit 30 outputs the clock signal CLKA (high-level signal) of the clock signal terminal CLK to the signal output terminal OUTPUT, which outputs the gate scan signal.

For example, under the control of the high potential of the pull-up node PU, the pull-down control circuit 60 pulls down the potential of the pull-down node PD to the third power voltage output from the third voltage terminal V3. At this point, none of the first input circuit 10, the second input circuit 20, the noise reduction circuit 80, the pull-down circuit 70 and the pull-up node reset circuit 40 is turned on.

For example, when the structure of each circuit in the above-mentioned shift register unit is as shown in FIG. 3 or 4, and all the transistors in each circuit are N-type transistors, as shown in FIG. 5, at the output phase P2, the clock signal terminal CLK outputs a high-level signal (CLKA), the first signal terminal IN1 outputs a low-level signal, the second signal terminal IN2 outputs a low-level signal, the third signal terminal IN3 outputs a low-level signal, the fourth voltage terminal V4 outputs a high-level voltage; the voltage of the pull-up node PU is at a high level, and the voltage of the pull-down node PD is at a low level. At this point, the signal output terminal OUTPUT outputs a high-level signal.

For example, under the control of the high-level of the pull-up node PU, the output circuit 30 outputs the clock signal CLKA (high-level signal) output from the clock signal terminal CLK to the signal output terminal OUTPUT. For example, at the output phase P2, since the first signal terminal IN1 outputs a low-level signal, the third transistor M3 is turned off. The capacitor C charges the pull-up node PU, such that the fifth transistor M5 is kept turned on. In this case, the clock signal CLKA output from the clock signal terminal CLK is output to the signal output terminal OUTPUT by the fifth transistor M5. In addition, under the action of the bootstrapping of the capacitor C, the potential of the pull-up node PU further rises, so as to keep the fifth transistor M5 turned on, such that the clock signal CLKA output from the clock signal terminal CLK may be output to the gate line connected with the signal output terminal OUTPUT, as the gate scan signal.

For example, as shown in FIG. 3, under the control of the high potential of the pull-up node PU, the seventh transistor M7 is turned on. Under the control of the high-level fourth power voltage output from the fourth voltage terminal V4, the sixth transistor M6 is turned on. However, since a width to length ratio of a channel of the seventh transistor M7 is greater than that of the channel of the sixth transistor M6, the potential of the pull-down node PD is still pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

For example, as shown in FIG. 4, under the control of the high potential of the pull-up node PU, the seventh transistor M7 and the ninth transistor M9 are turned on. Under the control of the high-level fourth power voltage output from the fourth voltage terminal V4, the eighth transistor M8 is turned on. However, since a width to length ratio of a channel of the ninth transistor M9 is greater than that of the channel of the eighth transistor M8, the gate of the sixth transistor M6 is at a low level, thereby controlling the sixth transistor M6 to be turned off. The potential of the pull-down node PD is pulled down to the third power voltage output from the third voltage terminal V3 by the seventh transistor M7. In this case, the voltage of the pull-down node PD is a low-level signal, so the tenth transistor M10 and the eleventh transistor M11 are both turned off.

In addition, the third signal terminal IN3 outputs a low-level signal, such that the first transistor M1 and the second transistor M2 are both turned off; the second signal terminal IN2 outputs a low-level signal, such that the fourth transistor M4 is turned off.

For example, in some embodiments, the driving method further includes: a pull-down phase, at which under the control of the second signal terminal, the second input circuit outputs the voltage of the second voltage terminal to the pull-up node, so as to control the output circuit to be turned off; under the control of the pull-up node, the pull-down control circuit outputs the voltage of the fourth voltage terminal to the pull-down node; under the control of the pull-down node, the pull-down circuit outputs the voltage of the third voltage terminal to the signal output terminal, and the noise reduction circuit outputs the voltage of the third voltage terminal to the pull-up node.

For example, as shown in FIG. 5, at the pull-down phase P3, under the control of the second signal terminal IN2, the second input circuit 20 outputs the second power voltage of the second voltage terminal V2 to the pull-up node PU, so as to control the output circuit 30 to be turned off; under the control of the pull-up node PU, the pull-down control circuit 60 outputs the fourth power voltage (high-level signal) output from the fourth voltage terminal V4 to the pull-down node PD; under the control of the pull-down node PD, the pull-down circuit 70 outputs the third power voltage of the third voltage terminal V3 to the signal output terminal OUTPUT, and at the same time, the noise reduction circuit 80 outputs the third power voltage of the third voltage terminal V3 to the pull-up node PU.

For example, at the pull-down phase P3, none of the first input circuit 10, the second input circuit 20 and the pull-up node reset circuit 40 are turned on.

For example, when the structure of each circuit in the above-mentioned shift register unit is shown in FIG. 3 or 4, and all the transistors in each circuit are N-type transistors, as shown in FIG. 5, at the pull-down phase P3, the clock signal CLKA output from the clock signal terminal CLK is a low-level signal, the first signal terminal IN1 outputs a low-level signal, the second signal terminal IN2 outputs a high-level signal; the voltage of the pull-up node PU is a low-level signal, and the voltage of the pull-down node PD is at a high level. At this point, the signal output terminal OUTPUT outputs a low-level signal.

For example, the pull-down control circuit 60 outputs the fourth power voltage (high level) of the fourth voltage terminal V4 to the pull-down node PD. Under the control of the pull-down node PD, the pull-down circuit 70 outputs the third power voltage (low level) of the third voltage terminal V3 to the signal output terminal OUTPUT, and the noise reduction circuit 80 outputs the third power voltage (low level) of the third voltage terminal V3 to the pull-up node PU. For example, at this pull-down phase P3, since the second signal terminal IN2 outputs a high-level signal, the fourth transistor M4 is turned on, thereby pulling down the potential of the pull-up node PU to the second power voltage (low level) of the second voltage terminal V2, and turning off the fifth transistor M5.

For example, as shown in FIG. 3, under the control of the low potential of the pull-up node PU, the seventh transistor M7 is turned off. Under the control of the fourth power voltage output from the fourth voltage terminal V4, the sixth transistor M6 is turned on, and the fourth power voltage output from the fourth voltage terminal V4 is output to the pull-down node PD. Therefore, the voltage of the pull-down node PD is a high-level signal. Under the control of the high potential of the pull-down node PD, both the tenth transistor M10 and the eleventh transistor M11 are turned on, the potential of the pull-down node PD is pulled down to the third power voltage (low level) output from the third voltage terminal V3 by the eleventh transistor M11, and the potential of the signal output terminal OUTPUT is pulled down to the third power voltage output from the third voltage terminal V3 by the tenth transistor M10.

For example, as shown in FIG. 4, under the control of the potential of the pull-up node PU, the seventh transistor M7 and the ninth transistor M9 are both turned off. Under the control of the fourth power voltage (high level) output from the fourth voltage terminal V4, the eighth transistor M8 is turned on, and the fourth power voltage output from the fourth voltage terminal V4 is output to the gate of the sixth transistor M6 to control the sixth transistor to be turned on. The sixth transistor M6 outputs the fourth power voltage output from the fourth voltage terminal V4 to the pull-down node PD. Therefore, the voltage of the pull-down node PD is a high-level signal. Under the control of the high potential of the pull-down node PD, both the tenth transistor M10 and the eleventh transistor M11 are turned on, the potential of the pull-down node PD is pulled down to the third power voltage (low level) output from the third voltage terminal V3 by the eleventh transistor M11, and the potential of the signal output terminal OUTPUT is pulled down to the third power voltage output from the third voltage terminal V3 by the tenth transistor M10.

In addition, the first signal terminal IN1 outputs a low-level signal, such that the third transistor M3 is turned off; the third signal terminal IN3 outputs a low-level signal, such that the first transistor M1 and the second transistor M2 is both turned off.

For example, in some embodiments, the driving method further includes: a reset phase, at which under the control of the third signal terminal, the pull-up node reset circuit outputs the voltage of the third voltage terminal to the pull-up node.

For example, as shown in FIG. 5, at the reset phase P4, under the control of the third signal terminal IN3, the pull-up node reset circuit 40 outputs the voltage of the third voltage terminal V3 to the pull-up node PU, so as to reset the pull-up node PU, thereby turning off the output circuit 30; the signal output terminal reset circuit 50 outputs the voltage of the third voltage terminal V3 to the signal output terminal OUTPUT, and resets the signal output terminal OUTPUT.

For example, at the reset phase P4, none of the first input circuit 10, the second input circuit 20, the pull-down control circuit 60, the pull-down circuit 70 and the noise reduction circuit 80 is turned on.

For example, when the structure of each circuit in the above-mentioned shift register unit is shown in FIG. 3 or 4, and all the transistors in each circuit are N-type transistors, as shown in FIG. 5, at the reset phase 4, the first signal terminal IN1 outputs a low-level signal, the second signal terminal IN2 outputs a low-level signal, the third signal terminal IN3 outputs a high-level signal, the fourth voltage terminal V4 outputs a low-level signal; the voltage of the pull-up node PU is a low-level signal, and the voltage of the pull-down node PD is a low-level signal. At this point, the signal output terminal OUTPUT outputs a low-level signal.

For example, under the control of the third signal terminal IN3, the pull-up node reset circuit 40 pulls down the voltage of the pull-up node PU to the third power voltage of the third voltage terminal V3, and thus the output circuit 30 is disconnected and the high-level signal of the clock signal terminal CLK cannot be output. For example, at the reset phase P4, the third signal terminal IN3 outputs a high-level signal, thereby turning on the first transistor ML. The first transistor M1 inputs the third power voltage of the third voltage terminal V3 to the pull-up node PU, so as to reset the pull-up node PU. At this point, under the control of the pull-up node PU, the fifth transistor M5 is turned off; the third signal terminal IN3 outputs a high-level signal, thereby turning on the second transistor M2. The second transistor M2 inputs the third power voltage of the third voltage terminal V3 to the signal output terminal OUTPUT, so as to reset the signal output terminal OUTPUT.

For example, at the reset phase P4, except that the first transistor M1 and the second transistor M2 are turned on, other transistors are turned off.

Figure 10:
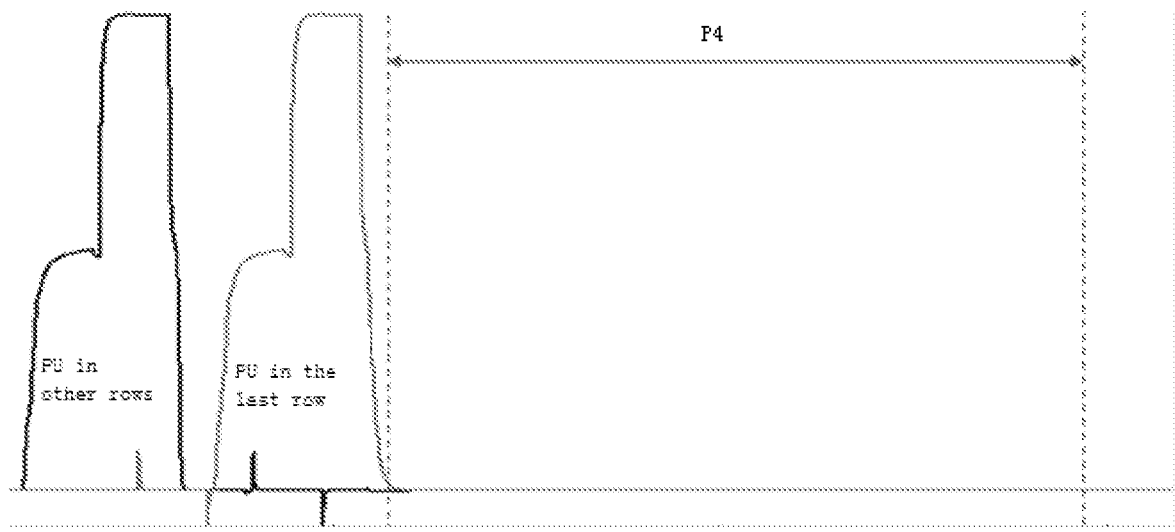
FIG. 10 is a waveform diagram of a pull-up node in a gate driving circuit according to an embodiment of the present disclosure.

It should be noted that firstly, as shown in FIG. 6, for the shift register unit at the last stage, after the third signal terminal IN3 outputs a high-level signal, the second signal terminal IN2 does not output a high-level signal until the next frame starts. That is, at the above-mentioned four phases, after the execution of the input phase P1 and the output phase P2, the shift register unit at the last phase executes the reset phase P4 and then the pull-down phase P3; for the shift register units at other stages, the four phases are executed in sequence. Therefore, the waveform diagram of the potential of the pull-up node PU is as shown in FIG. 10, the pull-up node of the shift register unit at the last stage may be pulled down directly at the reset phase P4 after the scanning of this frame is finished, without waiting for the start of scanning the next frame.

Secondly, when no signal output terminal reset circuit 50 is arranged in the shift register unit, the steps related to the noise reduction circuit 80 may be removed from the above-mentioned driving method, without changing other steps.

The foregoing descriptions are merely particular embodiments of the present disclosure, and the protection scope of the present disclosure is not limited thereto. A person skilled in the art may easily make various modifications or substitutions within the technical scope of the present disclosure. All such modifications and substitutions shall fall within the protection scope of the present disclosure. Therefore, the protection scope of the present disclosure shall be subject to that of claims.

What is claimed is:

1. A shift register unit, comprising a first input circuit, a second input circuit, an output circuit and a pull-up node reset circuit; wherein
the first input circuit is connected with a first signal terminal, a first voltage terminal and a pull-up node, and configured for outputting a voltage of the first voltage terminal to the pull-up node under a control of the first signal terminal;
the second input circuit is connected with a second signal terminal, a second voltage terminal and the pull-up node, and configured for outputting a voltage of the second voltage terminal to the pull-up node under a control of the second signal terminal;
the output circuit is connected with a clock signal terminal, the pull-up node and a signal output terminal, and configured for outputting a clock signal of the clock signal terminal to the signal output terminal under a control of the pull-up node;
the pull-up node reset circuit is connected with a third signal terminal, a third voltage terminal and the pull-up node, and configured for outputting a voltage of the third voltage terminal to the pull-up node under a control of the third signal terminal.

2. The shift register unit according to claim 1, further comprising a signal output terminal reset circuit;
wherein the signal output terminal reset circuit is connected with the third signal terminal, the third voltage terminal, and the signal output terminal, and configured for outputting a voltage of the third voltage terminal to the signal output terminal under a control of the third signal terminal.

3. The shift register unit according to claim 2, wherein the signal output terminal reset circuit comprises a second transistor;
a gate of the second transistor is connected with the third signal terminal, a first electrode of the second transistor is connected with the third voltage terminal and a second electrode of the second transistor is connected with the signal output terminal.

4. The shift register unit according to claim 2, further comprising a pull-down control circuit, a pull-down circuit and a noise reduction circuit;
wherein the pull-down control circuit is connected with the third voltage terminal, the fourth voltage terminal, the pull-up node and the pull-down node, and configured for controlling a level of the pull-down node;
the pull-down circuit is connected with the pull-down node, the third voltage terminal and the signal output terminal, and configured for outputting a voltage of the third voltage terminal to the signal output terminal under a control of the pull-down node;
the noise reduction circuit is connected with the pull-down node, the third voltage terminal and the pull-up node, and configured for outputting a voltage of the third voltage terminal to the pull-up node under a control of the pull-down node.

5. The shift register unit according to claim 2, wherein the pull-up node reset circuit comprises a first transistor;
a gate of the first transistor is connected with the third signal terminal, a first electrode of the first transistor is connected with the third voltage terminal and a second electrode of the first transistor is connected with the pull-up node.

6. The shift register unit according to claim 1, further comprising a pull-down control circuit, a pull-down circuit and a noise reduction circuit;
wherein the pull-down control circuit is connected with the third voltage terminal, the fourth voltage terminal, the pull-up node and the pull-down node, and configured for controlling a level of the pull-down node;
the pull-down circuit is connected with the pull-down node, the third voltage terminal and the signal output terminal, and configured for outputting a voltage of the third voltage terminal to the signal output terminal under a control of the pull-down node;
the noise reduction circuit is connected with the pull-down node, the third voltage terminal and the pull-up node, and configured for outputting a voltage of the third voltage terminal to the pull-up node under a control of the pull-down node.

7. The shift register unit according to claim 6, wherein the pull-down control circuit comprises a sixth transistor and a seventh transistor;
a gate of the sixth transistor is connected with the fourth voltage terminal, a first electrode of the sixth transistor is connected with the fourth voltage terminal, and a second electrode of the sixth transistor is connected with the pull-down node;
a gate of the seventh transistor is connected with the pull-up node, a first electrode of the seventh transistor is connected with the third voltage terminal, and a second electrode of the seventh transistor is connected with the pull-down node.

8. The shift register unit according to claim 7, wherein the pull-down control circuit further comprises an eighth transistor and a ninth transistor;
a gate of the eighth transistor is connected with the fourth voltage terminal, a first electrode of the eighth transistor is connected with the fourth voltage terminal, and a second electrode of the eighth transistor is connected with the gate of the sixth transistor;
a gate of the ninth transistor is connected with the pull-up node, a first electrode of the ninth transistor is connected with the third voltage terminal, and a second electrode of the ninth transistor is connected with the gate of the sixth transistor.

9. The shift register unit according to claim 6, wherein the pull-down circuit comprises a tenth transistor; the noise reduction circuit comprises an eleventh transistor;
a gate of the tenth transistor is connected with the pull-down node, a first electrode of the tenth transistor is connected with the third voltage terminal, and a second electrode of the tenth transistor is connected with the signal output terminal;
a gate of the eleventh transistor is connected with the pull-down node, a first electrode of the eleventh transistor is connected with the third voltage terminal, and a second electrode of the eleventh transistor is connected with the pull-up node.

10. The shift register unit according to claim 6, wherein the pull-up node reset circuit comprises a first transistor;
a gate of the first transistor is connected with the third signal terminal, a first electrode of the first transistor is connected with the third voltage terminal and a second electrode of the first transistor is connected with the pull-up node.

11. The shift register unit according to claim 6, wherein the signal output terminal reset circuit comprises a second transistor;
a gate of the second transistor is connected with the third signal terminal, a first electrode of the second transistor is connected with the third voltage terminal and a second electrode of the second transistor is connected with the signal output terminal.

12. The shift register unit according to claim 1, wherein the pull-up node reset circuit comprises a first transistor;
a gate of the first transistor is connected with the third signal terminal, a first electrode of the first transistor is connected with the third voltage terminal and a second electrode of the first transistor is connected with the pull-up node.

13. The shift register unit according to claim 1, wherein the first input circuit comprises a third transistor; the second input circuit comprises a fourth transistor;
a gate of the third transistor is connected with the first signal terminal, a first electrode of the third transistor is connected with the first voltage terminal and a second electrode of the third transistor is connected with the pull-up node;
a gate of the fourth transistor is connected with the second signal terminal, a first electrode of the fourth transistor is connected with the second voltage terminal and a second electrode of the fourth transistor is connected with the pull-up node.

14. The shift register unit according to claim 1, wherein the output circuit comprises a fifth transistor and a capacitor;
a gate of the fifth transistor is connected with the pull-up node, a first electrode of the fifth transistor is connected with the clock signal terminal and a second electrode of the fifth transistor is connected with the signal output terminal and a second terminal of the capacitor;
a first terminal of the capacitor is connected with the pull-up node, and the second terminal of the capacitor is further connected with the signal output terminal.

15. A scan driving circuit, comprising at least two cascaded stages of shift register units according to claim 1;
the first signal terminal of the shift register unit at a first stage is connected with a start signal terminal;
except the shift register unit at the first stage, the first signal terminal of the shift register unit at a stage is connected with the signal output terminal of the shift register unit at a previous stage;
except the shift register unit at a last stage, the second signal terminal of the shift register unit at a stage is connected with the signal output terminal of the shift register unit at a next stage;
the second signal terminal of the shift register unit at the last stage is connected with the start signal terminal.

16. A display device, comprising the gate driving circuit according to claim 15.

17. A method of driving the gate driving circuit according to claim 15, comprising:
during a scan phase of a frame:
receiving by the shift register unit at the first stage of the gate driving circuit a start signal of the start signal terminal, and turning on the shift register units in the gate driving circuit stage by stage;
during a field blanking phase of the frame:
outputting a voltage of the third voltage terminal to the pull-up node of each of the cascaded shift register units under a control of the third signal terminal, so as to reset the pull-up node of each of the cascaded shift register units.

18. A method of driving a shift register unit according to any claim 1, comprising:
an input phase:
outputting by the first input circuit a voltage of the first voltage terminal to the pull-up node, under a control of the first signal terminal;
an output phase:
outputting by the output circuit the clock signal of the clock signal terminal to the signal output terminal which outputs a gate scan signal, under a control of the pull-up node.

19. The driving method according to claim 18, wherein the shift register unit further comprises a pull-down control circuit, a pull-down circuit, and a noise reduction circuit,
the driving method further comprises:
a pull-down phase:
outputting by the second input circuit a voltage of the second voltage terminal to the pull-up node under a control of the second signal terminal, so as to control the output circuit to be turned off;
outputting by the pull-down control circuit a voltage of a fourth voltage terminal to a pull-down node under a control of the pull-up node;
outputting by the pull-down circuit a voltage of the third voltage terminal to the signal output terminal, and outputting by the noise reduction circuit a voltage of the third voltage terminal to the pull-up node, under a control of the pull-down node.

20. The driving method according to claim 18, further comprising:
a reset phase:
outputting by the pull-up node reset circuit a voltage of the third voltage terminal to the pull-up node under a control of the third signal terminal.

* * * * *